(12) United States Patent
Hwang et al.

(10) Patent No.: US 8,487,420 B1
(45) Date of Patent: Jul. 16, 2013

(54) PACKAGE IN PACKAGE SEMICONDUCTOR DEVICE WITH FILM OVER WIRE

(75) Inventors: Chan Ha Hwang, Anyang-si (KR); Eun Sook Sohn, Seongdong-gu (KR); Ho Choi, Jungnang-gu (KR); Byong Jin Kim, Bucheon-si (KR); Ji Yeon Yu, Seongnam-si (KR); Min Woo Lee, Mapo-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 109 days.

(21) Appl. No.: 12/330,424

(22) Filed: Dec. 8, 2008

(51) Int. Cl.
*H01L 23/02* (2006.01)

(52) U.S. Cl.
USPC .......................... 257/686; 257/777; 257/787

(58) Field of Classification Search
USPC ................. 257/686, 777, 723, 724, 778, 787
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |

(Continued)

FOREIGN PATENT DOCUMENTS

| | | |
|---|---|---|
| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

*Primary Examiner* — S. V. Clark

(57) ABSTRACT

In accordance with the present invention, there is provided multiple embodiments of a package-in-package semiconductor device including shortened electrical signal paths to optimize electrical performance. The semiconductor device comprises a substrate having a conductive pattern formed thereon. In each embodiment of the semiconductor device, a semiconductor package and one or more semiconductor dies are vertically stacked upon the substrate, and placed into electrical communication with the conductive pattern thereof. In certain embodiments, a semiconductor die which is electrically connected to the conductive pattern of the substrate may be fully or partially covered with a film-over-wire. Additionally, in each embodiment of the semiconductor device, the vertically stacked electronic components thereof may be covered with a package body which also partially covers the substrate.

18 Claims, 9 Drawing Sheets

U.S. PATENT DOCUMENTS

| | | | |
|---|---|---|---|
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Sclesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, III et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,767,566 A | 6/1998 | Suda | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,511 A | 12/1998 | Shin et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| RE36,773 E | 7/2000 | Nomi et al. | |
| 6,107,679 A | 8/2000 | Noguchi | |
| 6,143,981 A | 11/2000 | Glenn | |
| 6,150,709 A | 11/2000 | Shin et al. | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |

| | | |
|---|---|---|
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Oloffson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,552,423 B2 * | 4/2003 | Song et al. ............ 257/679 |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,838,761 B2 | 1/2005 | Karnezos |
| 6,858,919 B2 | 2/2005 | Seo et al. |
| 6,861,288 B2 | 3/2005 | Shim et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,906,416 B2 | 6/2005 | Karnezos |
| 6,927,478 B2 | 8/2005 | Paek |
| 6,933,598 B2 | 8/2005 | Karnezos |
| 6,946,323 B1 | 9/2005 | Heo |
| 6,967,125 B2 | 11/2005 | Fee et al. |
| 6,972,481 B2 | 12/2005 | Karnezos |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,034,387 B2 | 4/2006 | Karnezos |
| 7,045,396 B2 | 5/2006 | Crowley et al. |
| 7,045,887 B2 | 5/2006 | Karnezos |
| 7,049,691 B2 | 5/2006 | Karnezos |
| 7,053,469 B2 | 5/2006 | Koh et al. |
| 7,053,476 B2 | 5/2006 | Karnezos |
| 7,053,477 B2 | 5/2006 | Karnezos |
| 7,057,269 B2 | 6/2006 | Karnezos |
| 7,061,088 B2 | 6/2006 | Karnezos |
| 7,064,426 B2 | 6/2006 | Karnezos |
| 7,075,816 B2 | 7/2006 | Fee et al. |
| 7,101,731 B2 | 9/2006 | Karnezos |
| 7,102,209 B1 | 9/2006 | Bayan et al. |
| 7,109,572 B2 | 9/2006 | Fee et al. |
| 7,166,494 B2 | 1/2007 | Karnezos |
| 7,169,642 B2 | 1/2007 | Karnezos |
| 7,185,426 B2 | 3/2007 | Hiner et al. |
| 7,193,298 B2 | 3/2007 | Hong et al. |
| 7,202,554 B1 | 4/2007 | Kim et al. |
| 7,205,647 B2 | 4/2007 | Karnezos |
| 7,211,471 B1 | 5/2007 | Foster |
| 7,245,007 B1 | 7/2007 | Foster |
| 7,247,519 B2 | 7/2007 | Karnezos |
| 7,253,503 B1 | 8/2007 | Fusaro et al. |
| 7,253,511 B2 | 8/2007 | Karnezos et al. |
| 7,271,496 B2 | 9/2007 | Kim |
| 7,279,361 B2 | 10/2007 | Karnezos |
| 7,288,434 B2 | 10/2007 | Karnezos |
| 7,288,835 B2 | 10/2007 | Yim et al. |
| 7,298,037 B2 | 11/2007 | Yim et al. |
| 7,298,038 B2 | 11/2007 | Filoteo, Jr. et al. |
| 7,306,973 B2 | 12/2007 | Karnezos |
| 7,312,519 B2 | 12/2007 | Song et al. |
| 7,635,913 B2 * | 12/2009 | Kim et al. ............ 257/686 |

| | | | | | | |
|---|---|---|---|---|---|---|
| 7,645,634 B2 * | 1/2010 | Karnezos ............... 438/107 | 2004/0253803 A1 | 12/2004 | Tomono et al. | |
| 7,659,609 B2 * | 2/2010 | Ha et al. ................ 257/686 | 2006/0087020 A1 | 4/2006 | Hirano et al. | |
| 7,674,640 B2 * | 3/2010 | Ha et al. ................. 438/26 | 2006/0157843 A1 | 7/2006 | Hwang | |
| 7,683,469 B2 * | 3/2010 | Oh et al. ................ 257/686 | 2006/0175715 A1 * | 8/2006 | Hirose et al. ............. 257/787 |
| 7,687,313 B2 * | 3/2010 | Karnezos ............... 438/107 | 2006/0231939 A1 | 10/2006 | Kawabata et al. | |
| 7,692,279 B2 * | 4/2010 | Karnezos et al. ....... 257/686 | 2007/0023202 A1 | 2/2007 | Shibata | |
| 7,872,340 B2 * | 1/2011 | Choi et al. .............. 257/686 | 2007/0052082 A1 * | 3/2007 | Lee et al. ............. 257/686 |
| 7,968,995 B2 * | 6/2011 | Ko et al. ................ 257/686 | 2008/0230887 A1 | 9/2008 | Sun et al. | |
| 7,977,802 B2 * | 7/2011 | Pagaila et al. .......... 257/778 | 2009/0001612 A1 * | 1/2009 | Song et al. ............. 257/787 |
| 2001/0008305 A1 | 7/2001 | McClellan et al. | 2010/0072634 A1 * | 3/2010 | Ha et al. ............. 257/787 |
| 2001/0014538 A1 | 8/2001 | Kwan et al. | | | | |
| 2002/0011654 A1 | 1/2002 | Kimura | FOREIGN PATENT DOCUMENTS | | | |
| 2002/0024122 A1 | 2/2002 | Jung et al. | EP | 0720234 | 3/1996 | |
| 2002/0027297 A1 | 3/2002 | Ikenaga et al. | EP | 0936671 | 8/1999 | |
| 2002/0038873 A1 | 4/2002 | Hiyoshi | EP | 1032037 | 8/2000 | |
| 2002/0072147 A1 | 6/2002 | Sayanagi et al. | JP | 5745959 | 3/1982 | |
| 2002/0111009 A1 | 8/2002 | Huang et al. | JP | 60010756 | 1/1985 | |
| 2002/0140061 A1 | 10/2002 | Lee | JP | 60231349 | 11/1985 | |
| 2002/0140068 A1 | 10/2002 | Lee et al. | JP | 6333854 | 2/1988 | |
| 2002/0140081 A1 | 10/2002 | Chou et al. | JP | 63205935 | 8/1988 | |
| 2002/0158318 A1 | 10/2002 | Chen | JP | 1106456 | 4/1989 | |
| 2002/0163015 A1 | 11/2002 | Lee et al. | JP | 3289162 | 12/1991 | |
| 2002/0167060 A1 | 11/2002 | Buijsman et al. | JP | 5129473 | 5/1993 | |
| 2003/0006055 A1 | 1/2003 | Chien-Hung et al. | JP | 6260532 | 9/1994 | |
| 2003/0030131 A1 | 2/2003 | Lee et al. | JP | 8083877 | 3/1996 | |
| 2003/0059644 A1 | 3/2003 | Datta et al. | JP | 964284 | 6/1996 | |
| 2003/0064548 A1 | 4/2003 | Isaak | JP | 8222682 | 8/1996 | |
| 2003/0073265 A1 | 4/2003 | Hu et al. | JP | 8306853 | 11/1996 | |
| 2003/0102537 A1 | 6/2003 | McLellan et al. | JP | 98205 | 1/1997 | |
| 2003/0164554 A1 | 9/2003 | Fee et al. | JP | 98206 | 1/1997 | |
| 2003/0168719 A1 | 9/2003 | Cheng et al. | JP | 98207 | 1/1997 | |
| 2003/0198032 A1 | 10/2003 | Collander et al. | JP | 9293822 | 11/1997 | |
| 2004/0027788 A1 | 2/2004 | Chiu et al. | JP | 10199934 | 7/1998 | |
| 2004/0056277 A1 | 3/2004 | Karnezos | JP | 2000150765 | 5/2000 | |
| 2004/0061212 A1 | 4/2004 | Karnezos | JP | 200203497 | 8/2002 | |
| 2004/0061213 A1 | 4/2004 | Karnezos | JP | 2003243595 | 8/2003 | |
| 2004/0063242 A1 | 4/2004 | Karnezos | JP | 2004158753 | 6/2004 | |
| 2004/0063246 A1 | 4/2004 | Karnezos | KR | 20000072714 | 12/2000 | |
| 2004/0065963 A1 | 4/2004 | Karnezos | WO | 9956316 | 11/1999 | |
| 2004/0080025 A1 | 4/2004 | Kasahara et al. | WO | 9967821 | 12/1999 | |
| 2004/0089926 A1 | 5/2004 | Hsu et al. | | | | |
| 2004/0164387 A1 | 8/2004 | Ikenaga et al. | * cited by examiner | | | |

PACKAGE IN PACKAGE SEMICONDUCTOR DEVICE WITH FILM OVER WIRE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices, and more particularly to a package-in-package (PIP) semiconductor device having optimized electrical signal paths to provide enhanced electrical performance.

2. Description of the Related Art

Package-in-package (PIP) semiconductor devices are currently known and used in the electrical arts. A typical PIP semiconductor device comprises various combinations of electronic components including passive devices, semiconductor dies, semiconductor packages, and/or other elements which are arranged in a horizontal direction, or stacked in a vertical direction on an underlying substrate. In many PIP devices, the substrate and the electronic components are interconnected to one another through the use of conductive wires alone or in combination with conductive bumps, with such electronic components thereafter being encapsulated by a suitable encapsulant material which hardens into a package body of the PIP device.

In typical PIP devices, a large number of conductive wires are needed to facilitate the electrical connection of the electronic components to each other and to the substrate in a prescribed pattern or arrangement. In the currently known PIP device configurations, and particularly those in which the electronic components are vertically stacked (i.e., extend perpendicularly relative to the substrate), the electrical signal paths in the PIP device are inevitably lengthened, thus resulting in a deterioration in the electrical performance of the PIP device. Further, the use of a large number of conductive wires leads to a high probability of shorting between the conductive wires in the encapsulation step described above as used to form the package body of the PIP device. Still further, in the event an increased number of electronic components are included in the PIP device, the design of the electrically conductive patterns on the substrate as needed to accommodate the conductive wires can be highly complex, thus adding to the difficulty in the fabrication of the PIP device and increasing the cost thereof. The present invention addresses these and other shortcomings of prior art PIP devices, as will be described in more detail below.

BRIEF SUMMARY OF THE INVENTION

In accordance with the present invention, there is provided multiple embodiments of a package-in-package semiconductor device including shortened electrical signal paths to optimize electrical performance. The semiconductor device comprises a substrate having a conductive pattern formed thereon. In each embodiment of the semiconductor device, a semiconductor package and one or more semiconductor dies are vertically stacked upon the substrate, and placed into electrical communication with the conductive pattern thereof. In certain embodiments, a semiconductor die which is electrically connected to the conductive pattern of the substrate may be fully or partially covered with a film-over-wire. Additionally, in each embodiment of the semiconductor device, the vertically stacked electronic components thereof may be covered with a package body which also partially covers the substrate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
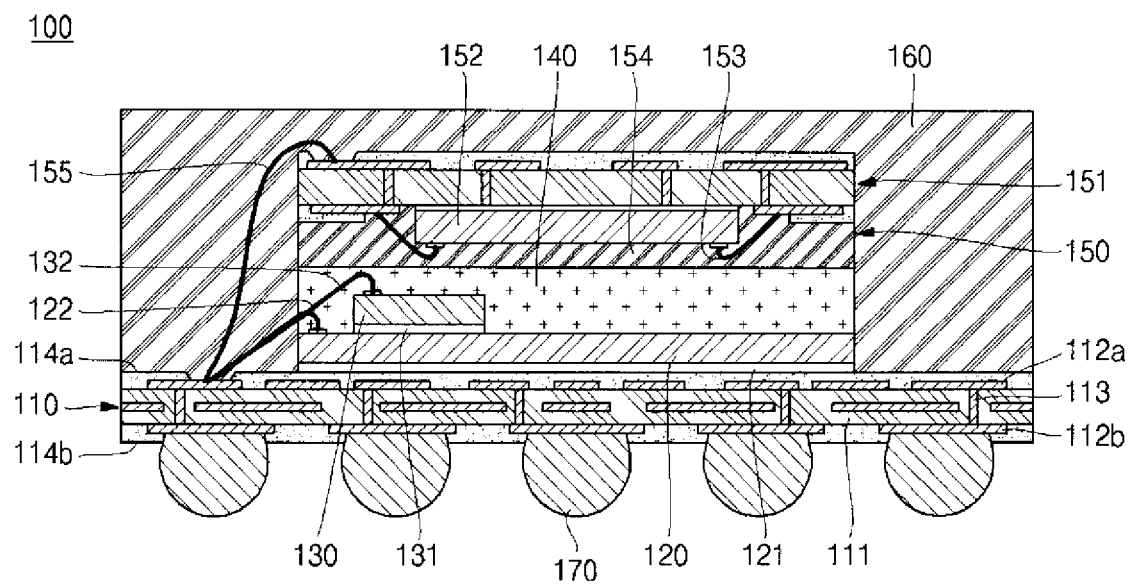
FIG. 1A is a cross-sectional view of a package-in-package semiconductor device constructed in accordance with a first embodiment of the present invention.

Referring now to the drawings wherein the showings are for purposes of illustrating various embodiments of the present invention and not for purposes of limiting the same, FIG. 1A depicts in cross-section a package-in-package semiconductor device 100 constructed in accordance with a first embodiment of the present invention. The semiconductor device 100 comprises a substrate 110 which preferably has a generally quadrangular configuration. The substrate 110 can be selected from common circuit boards (e.g., rigid circuit boards and flexible circuit boards) and equivalents thereof. In this regard, the present invention is not intended to be limited to any particular type of substrate 110. By way of example and not by way of limitation, the substrate 110 may include an insulating layer 111 having opposed, generally planar top and bottom surfaces. Disposed on the top surface is an electrically conductive pattern 112a, while disposed on the bottom surface is an electrically conductive pattern 112b. The conductive patterns 112a, 112b are electrically interconnected to each other in a prescribed pattern or arrangement through the use of conductive vias 113 which extend through the insulating layer 111 in a direction generally perpendicularly between the top and bottom surfaces thereof. A solder mask 114a is preferably coated on at least portions of the conductive pattern 112a and the top surface of the insulating layer 111. Similarly, a solder mask 114b is preferably coated on at least portions of the conductive pattern 112b and the bottom surface of the insulating layer 111. The solder masks 114a, 114b are used to protect portions of the conductive patterns 112a, 112b which would otherwise be exposed to the ambient environment. Those of ordinary skill in the art will recognize that the substrate 110 may alternatively comprise a multi-layer circuit board wherein the conductive patterns 112, 112b are formed inside the insulating layer 111.

The semiconductor device 100 further comprises a first (bottom) semiconductor die 120 which is electrically connected to the substrate 110, and in particular to the conductive pattern 112a thereof. The first semiconductor die 120 defines opposed, generally planar top and bottom surfaces, with the bottom surface be secured to a portion of the solder mask 114a (and hence the substrate 110) through the use of an adhesive layer 121. The first semiconductor die 120 includes a plurality of conductive contacts or terminals disposed on the top surface thereof. As seen in FIG. 1A, each of the terminals is electrically connected to the conductive pattern 112a of the substrate 110 through the use of respective ones of a plurality of conductive wires 122.

Figure 1B:
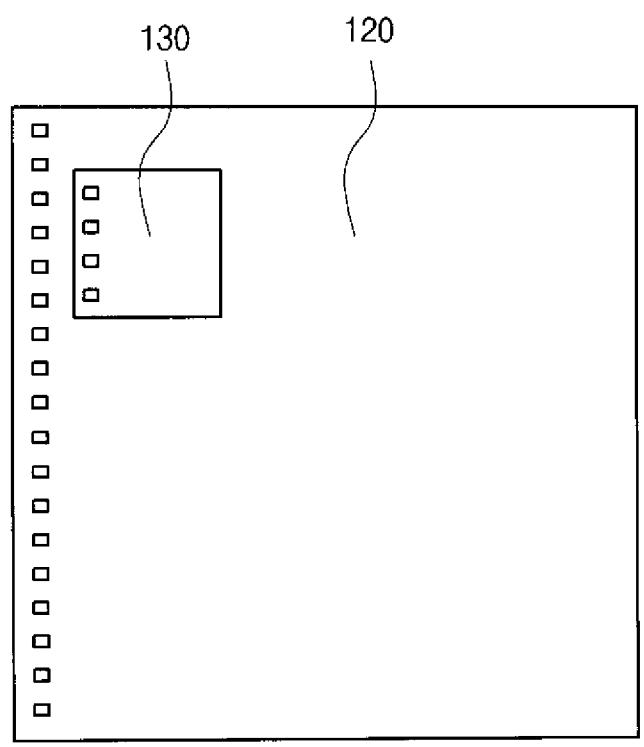
FIG. 1B is a top plan view of a stacked pair of semiconductor dies which are integrated into the package-in-package semiconductor device shown in FIG. 1A.

The semiconductor device 100 further comprises a second (middle) semiconductor die 130 which is attached to the first semiconductor die 120 and is electrically connected to the substrate 110. More particularly, as seen in FIGS. 1A and 1B, the second semiconductor die 130 defines opposed, generally planar top and bottom surfaces, with the bottom surface being secured to a portion of the top surface of the first semiconductor die 120 through the use of an adhesive layer 131. The second semiconductor die 130 includes a plurality of contacts or terminals exposed on the top surface thereof, such terminals being electrically connected to the conductive pattern 112a of the substrate 110 through the use of respective ones of a plurality of conductive wires 132. Although a single second semiconductor die 130 is shown in FIGS. 1A and 1B, those of ordinary skill in the art will recognize that the semiconductor device 100 may include two or more second semiconductor dies 130 (each of which is electrically connected to the substrate 110) without departing from the spirit and scope of the present invention. That is, no limitation is imposed on the number of second semiconductor dies 130 included in the semiconductor device 100. Further, though the second semiconductor die 130 is shown as being disposed in one of the corner regions defined by the top surface of the first semiconductor die 120, those of ordinary skill in the art will recognize that alternative locations for the second semiconductor die 130 relative to the first semiconductor 120 are also contemplated to be within the spirit and scope of the present invention.

The semiconductor device 100 further comprises a film-over-wire (FOW) 140 which is disposed on the top surface of the first semiconductor die 120 and completely covers the second semiconductor die 130 disposed thereon. In addition, the FOW 140 covers portions of the conductive wires 122, 132. Though not shown in FIG. 1A, it is contemplated that the peripheral side surfaces of the first semiconductor die 120 may also be covered by the FOW 140. The FOW 140 is preferably a die attach material which remains in semi-cured state (B-stage) before curing. Accordingly, when the FOW 140 is applied to the first semiconductor die 120 and second semiconductor die 130, the conductive wires 122, 132 are naturally situated within the FOW 140.

The semiconductor device 100 further comprises a semiconductor package 150 which is disposed on the FOW 140 and electrically connected to the substrate 110. The semiconductor package 150 comprises an inner substrate 151 which includes an insulating layer defining opposed top and bottom surfaces and electrically conductive patterns formed on respective ones of the opposed top and bottom surfaces of the insulating layer. In the inner substrate 151, the conductive patterns disposed on respective ones of the opposed top and bottom surfaces of the insulating layer are electrically connected to each other in a prescribed pattern or arrangement through the use of vias which extend through the insulating layer. The inner substrate 151 of the semiconductor package 150 can itself be selected from rigid circuit boards, flexible circuit boards and equivalents thereto, with the structure of the inner substrate 151 preferably being the same as that of the substrate 110 described above. Attached to the insulating layer of the inner substrate 151 is an inner semiconductor die 152. In the semiconductor package 150, the inner semiconductor die 152 is electrically connected to the conductive patterns of the inner substrate 151 through the use of inner conductive wires 153. The inner semiconductor die 152, the inner conductive wires 153, and a portion of the inner substrate 151 are covered by an inner package body 154, the side surfaces of which extend in generally flush relation to the side surfaces of the inner substrate 151. As shown in FIG. 1A, that surface of the inner substrate 151 opposite that partially covered by the inner package body 154 may itself be partially covered with a solder mask which is applied thereto.

In fabricating the semiconductor device 100, the inner package body 154 of the semiconductor package 150 is initially positioned upon the top surface of the FOW 140. Heat curing is then conducted to strongly adhere the FOW 140 to the semiconductor package 150 while hardening the FOW 140. Thus, the FOW 140 serves to adhere the first semiconductor die 120 and the semiconductor package 150 to each other. Though the inner package body 154 of the semiconductor package 150 is adhered to the FOW 140, such inner package body 154 is not in contact with the second semiconductor die 130 or those conductive wires 122, 132 positioned within the FOW 140. In the semiconductor device 100, the semiconductor package 150 is electrically connected to the substrate 110 through the use of at least one conductive wire 155. As seen in FIG. 1A, one end of the conductive wire 155 is electrically connected to an exposed portion of one of the conductive patterns of the inner substrate 151 of the semiconductor package 150, with the remaining end of the same conductive wire 155 being electrically connected to the conductive pattern 112a of the substrate 110.

In the semiconductor device 100, at least portions of the first semiconductor die 120, the FOW 140, the semiconductor package 150, and the conductive wires 122, 132, 155 are each encapsulated or covered by an encapsulant material which ultimately hardens into a package body 160 of the semiconductor device 100. The present invention is not intended to be limited to any specific material which could be used to facilitate the fabrication of the package body 160. For example, and not by way of limitation, the package body 160 can be formed from epoxy molding compounds or equivalents thereto. The fully formed package body 160 preferably includes side surfaces which extend in generally flush or co-planar relation to respective side surfaces of the insulating layer 111 of the substrate 110.

The semiconductor device 100 further comprises a plurality of solder balls 170 which are electrically connected to the conductive pattern 112b of the substrate 110 in a prescribed pattern or arrangement. As seen in FIG. 1A, the solder mask 114b extends into contact with the solder balls 170. Examples of suitable materials for the solder balls 150 include, but are not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi), or equivalents thereto.

In the semiconductor device 100, the FOW 140 is disposed between the first and second semiconductor dies 120, 130 as indicated above. This particular configuration avoids the use of a silicon dummy spacer, an epoxy, etc. in the semiconductor device 100, and further eliminates the need for the back grinding of a silicon dummy spacer, sawing, attachment, etc, thus reducing material costs and simplifying the fabrication process for the semiconductor device 100.

Figure 2:
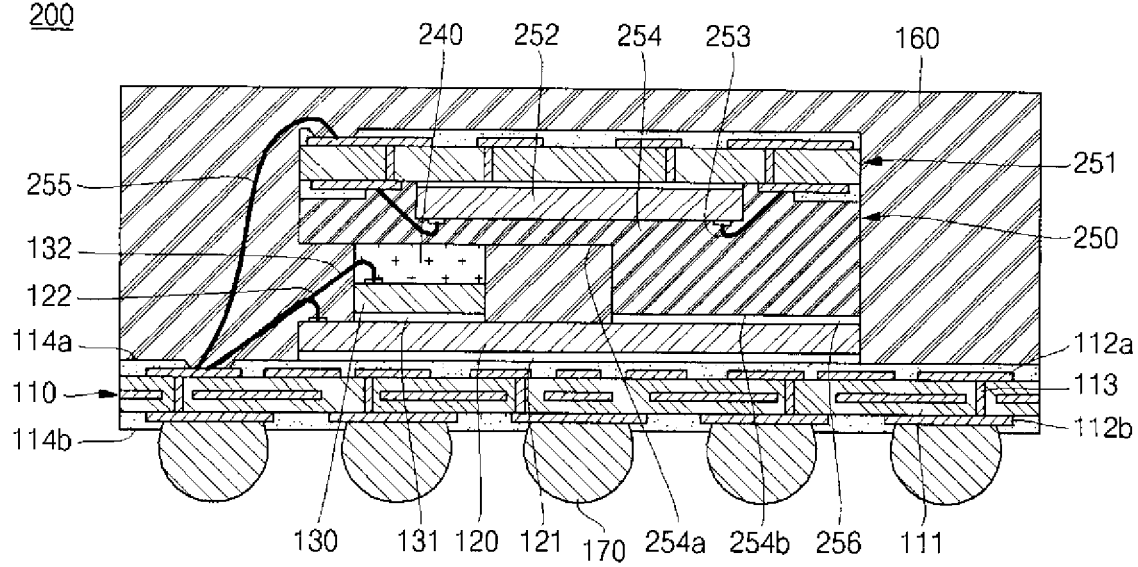
FIG. 2 is a cross-sectional view of a package-in-package semiconductor device constructed in accordance with a second embodiment of the present invention.

Referring now to FIG. 2, there is shown a semiconductor device 200 constructed in accordance with a second embodiment of the present invention. The semiconductor device 200 is substantially similar to the above-described semiconductor device 100, with only the differences between the semiconductor devices 200, 100 being described below.

The primary distinction between the semiconductor devices 200, 100 lies in the substitution of the semiconductor package 150 of the semiconductor device 100 with the semiconductor package 250 in the semiconductor device 200. The semiconductor package 250 comprises an inner substrate 251 which includes an insulating layer defining opposed top and bottom surfaces and electrically conductive patterns formed on respective ones of the opposed top and bottom surfaces of the insulating layer. In the inner substrate 251, the conductive patterns disposed on respective ones of the opposed top and bottom surfaces of the insulating layer are electrically connected to each other in a prescribed pattern or arrangement through the use of vias which extend through the insulating layer. The inner substrate 251 of the semiconductor package 250 can itself be selected from rigid circuit boards, flexible circuit boards and equivalents thereto, with the structure of the inner substrate 251 preferably being the same as that of the substrate 110 described above. Attached to the insulating layer of the inner substrate 251 is an inner semiconductor die 252. In the semiconductor package 250, the inner semiconductor die 252 is electrically connected to the conductive patterns of the inner substrate 251 through the use of inner conductive wires 253. The inner semiconductor die 252, the inner conductive wires 253, and a portion of the inner substrate 251 are covered by an inner package body 254, the side surfaces of which extend in generally flush relation to the side surfaces of the inner substrate 251. As shown in FIG. 2, that surface of the inner substrate 251 opposite that partially covered by the inner package body 254 may itself be partially covered with a solder mask which is applied thereto. In the semiconductor device 100, the semiconductor package 250 is electrically connected to the substrate 110 through the use of at least one conductive wire 255. As seen in FIG. 2, one end of the conductive wire 255 is electrically connected to an exposed portion of one of the conductive patterns of the inner substrate 251 of the semiconductor package 250, with the remaining end of the same conductive wire 255 being electrically connected to the conductive pattern 112a of the substrate 110.

In the semiconductor package 250, the inner package body 254 defines a generally planar first surface portion 254a which extends along a first plane, and a generally planar second surface portion 254b which extends along a second plane disposed in spaced, generally parallel relation to the first plane along which the first surface portion 254a extends. Thus, as viewed from the perspective shown in FIG. 2, the second surface portion 254b of the inner package body 254 is disposed below the first surface portion 254a (i.e., the first surface portion 254a is recessed relative to the second surface portion 254b). In the semiconductor device 200, the second surface portion 254b is attached to a portion of the top surface of the first semiconductor die 120 through the use of an adhesive layer 256.

A further distinction between the semiconductor devices 200, 100 lies in the size and configuration of the FOW 240 of the semiconductor device 200 in comparison to the FOW 140 of the semiconductor device 100. More particularly, in the semiconductor device 200, the FOW 240 is sized to cover only the top surface of the second semiconductor die 130 and a portion of the conductive wire 132 extending thereto as shown in FIG. 2. Thus, the FOW 240 does not cover any peripheral side surface of the second semiconductor die 130, or any portion of the top surface of the first semiconductor die 120. However, as shown in FIG. 2, the first surface portion 254a of the inner package body 254 contacts the FOW 240. Though not shown, it is contemplated that the FOW 240 may alternatively be configured to cover the peripheral side surfaces of the second semiconductor die 130.

In the semiconductor device 200, the package body 160 covers at least portions of the first semiconductor die 120, the second semiconductor die 130, the FOW 240, the semiconductor package 250, and the conductive wires 122, 132, 255. As further seen in FIG. 2, a portion of the package body 160 is filled between the first surface portion 254a of the inner package body 254 and the top surface of the first semiconductor die 120.

The semiconductor device 200 is configured such that the first and second surface portions 254a, 254b are formed in the inner package body 254 of the semiconductor package 250 with the differing step heights or elevations as described above. With this configuration, the semiconductor package 250 can be stacked on the first semiconductor die 120 in a stable manner without the use of any spacer, thus contributing to the simplification of the fabrication process for the semiconductor device 200 and a reduction in the overall thickness thereof.

Figure 3:
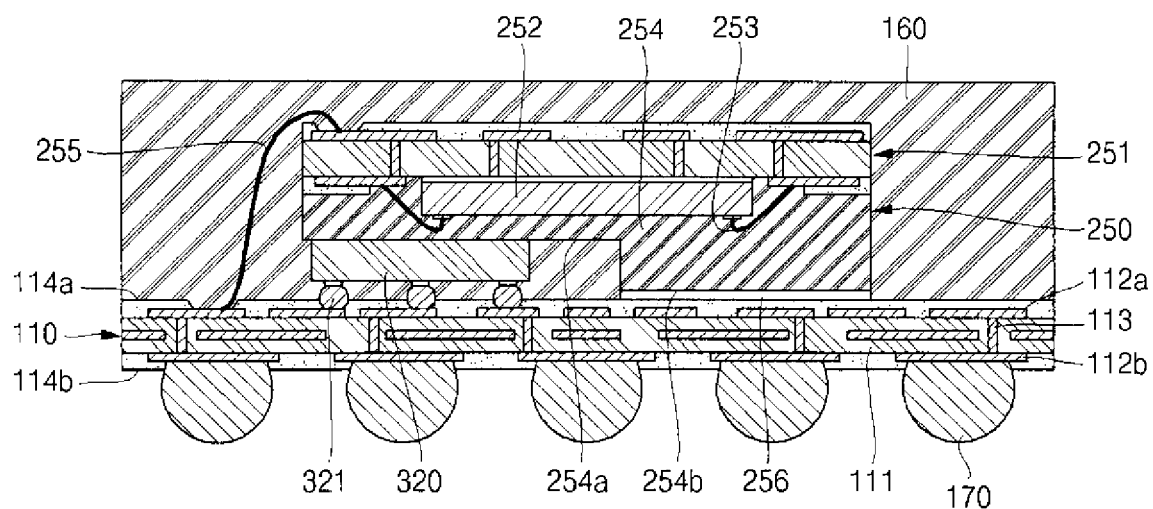
FIG. 3 is a cross-sectional view of a package-in-package semiconductor device constructed in accordance with a third embodiment of the present invention.

Referring now to FIG. 3, there is shown a semiconductor device 300 constructed in accordance with a third embodiment of the present invention. The semiconductor device 300 is also substantially similar to the above-described semiconductor device 200, with only the differences between the semiconductor devices 300, 200 being described below.

The primary distinction between the semiconductor devices 300, 200 lies in the elimination of the FOW 240 in the semiconductor device 300, and the substitution of the first and second semiconductor dies 120, 130 of the semiconductor device 200 with the first (bottom) semiconductor die 320 in the semiconductor device 300. More particularly, as seen in FIG. 3, the first semiconductor die 320 defines opposed, generally planar top and bottom surfaces, and includes a plurality of conductive contacts or terminals disposed on the bottom surface thereof. These terminals are electrically connected to the conductive pattern 112a of the substrate 110 through the use of a plurality of conductive bumps 321. Examples of suitable materials for the conductive bumps 321 include, but are not limited to, gold, silver, soldering materials, or equivalents thereto.

In the semiconductor device 300, the first semiconductor die 320 is of a width which is smaller than that of the semiconductor package 250. In this regard, as seen in FIG. 3, the first surface portion 254a of the inner package body 254 of the semiconductor package 250 is in direct contact with the top surface of the first semiconductor die 320. However, the second surface portion 254b of the inner package body 254 does not contact the first semiconductor die 320. Rather, the second surface portion 254b of the inner package body 254 is attached to the substrate 110 (and in particular to a portion of the solder mask 114a) through the use of an adhesive layer 256.

In the semiconductor device 300, the package body 160 covers at least portions of the first semiconductor die 320, the conductive bumps 321, the semiconductor package 250, and the conductive wire 255. As seen in FIG. 3, a portion of the package body 160 is also filled in the gap between the first semiconductor die 320 and the substrate 110, thus encapsulating the conductive bumps 321. A portion of the package body 160 is also filled between the first surface portion 254a of the inner package body 254 and the substrate 110, such portion covering the first semiconductor die 320.

The semiconductor device 300 is configured such that the first and second surface portions 254a, 254b are formed in the inner package body 254 of the semiconductor package 250 with differing step heights or elevations as described above. With this configuration, the semiconductor package 250 can be easily positioned on the substrate 110 without the use of any spacer. In addition, since the semiconductor package 250 is directly adhered to the substrate 110 rather than to the first semiconductor die 320, the semiconductor device 300 is provided with a reduction in the thickness thereof.

Figure 4:
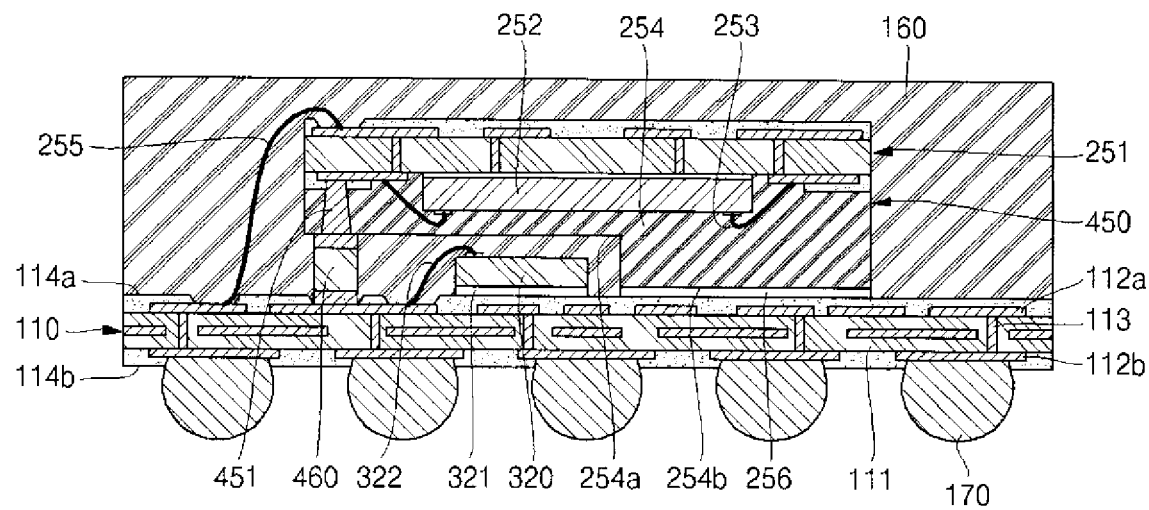
FIG. 4 is a cross-sectional view of a package-in-package semiconductor device constructed in accordance with a fourth embodiment of the present invention.

Referring now to FIG. 4, there is shown a semiconductor device 400 constructed in accordance with a fourth embodiment of the present invention. The semiconductor device 400 is substantially similar to the above-described semiconductor device 300, with only the differences between the semiconductor devices 400, 300 being described below.

One of the distinctions between the semiconductor devices 400, 300 lies in the first semiconductor die 320 in the semiconductor device 400 being electrically connected to the conductive pattern 112a of the substrate 110 through the use of at least one conductive wire 322, rather than through the use of the conductive bumps 321 described above in relation to the semiconductor device 300. In this regard, as seen in FIG. 4, at least one conductive wire 322 is used to electrically connect a conductive pad or terminal disposed on the generally planar top surface of the first semiconductor die 320 to the conductive pattern 112a of the substrate 110. The generally planar bottom surface of the first semiconductor die 320 is attached to the substrate 110 (and in particular to the solder mask 114a disposed thereon) through the use of an adhesive layer 321.

A further distinction between the semiconductor devices 400, 300 lies in the substitution of the semiconductor package 250 described above in relation to the semiconductor device 300 with the semiconductor package 450 included in the semiconductor device 400. The sole distinction between the semiconductor packages 450, 250 lies in the package body 254 of the semiconductor package 450 including at least one conductive through-mold via (TMV) 451 formed therein. Specifically, as shown in FIG. 4, the TMV 451 extends from the first surface portion 254a of the inner package body 254 to a portion of the conductive pattern disposed on that surface of the insulating layer of the inner substrate 251 to which the inner semiconductor die 252 is mounted. The TMV 451 is preferably formed by creating a hole in the inner package body 254 using a laser or an etching solution, and filling such hole with a conductive metal material selected from copper, aluminum, gold, silver, soldering materials or equivalents thereto.

A further distinction between the semiconductor devices 400, 300 lies in the inclusion of a passive device 460 in the semiconductor device 400. As seen in FIG. 4, the passive device 460 is interposed between and electrically connected to the TMV 451 of the semiconductor package 450 and the conductive pattern 112a of the substrate 110. The passive device 460 may be selected from resisters, inductors, capacitors, or equivalents thereto. Those of ordinary skill in the art will recognize that the present invention is not intended to be limited to any particular type of passive device 460. Apart from the passive device 460, a unit semiconductor device (e.g., a transistor or diode) or a semiconductor integrated circuit device may be interposed between the TMV 451 and the substrate 110.

In the semiconductor device 400, the package body 160 covers at least portions of the first semiconductor die 320, the semiconductor package 250, the passive device 460, and the conductive wires 255, 322. As seen in FIG. 4, the top surface of the first semiconductor die 320 is disposed in spaced relation to the first surface portion 254a of the inner package body 254, and thus is not in contact therewith. As a result, the conductive wires 322 used to electrically connect the first semiconductor die 320 to the substrate 110 are also not in contact with the inner package body 254 of the semiconductor package 450. Rather, a portion of the package body 160 is filled between the first surface portion 254a of inner package body 254 and the top surface of the first semiconductor die 320, such portion of the package body 160 also covering the conductive wire 322 and the passive device 460.

The semiconductor device 400 described above is configured such that the TMV 451 is formed in the inner package body 254 of the semiconductor package 450 to transmit ground or power from the semiconductor package 450 to the substrate 110. With this configuration, a ground or power path within the semiconductor package 450 is shortened by the TMV 451 to improve the electrical performance of the semiconductor device 400.

Figure 5:
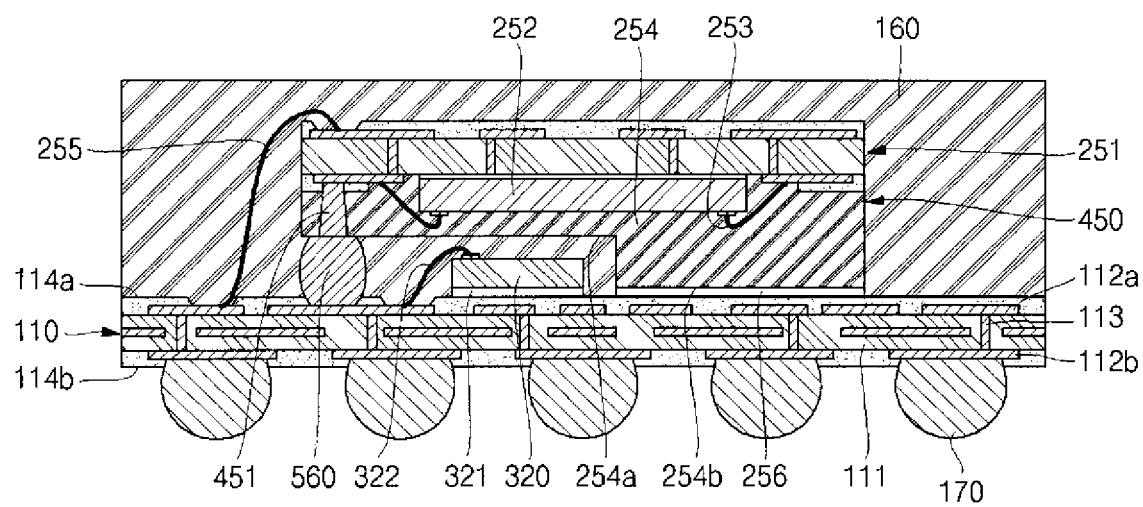
FIG. 5 is a cross-sectional view of a package-in-package semiconductor device constructed in accordance with a fifth embodiment of the present invention.

Referring now to FIG. 5, there is shown a semiconductor device 500 constructed in accordance with a fifth embodiment of the present invention. The semiconductor device 500 is similar to the above-described semiconductor device 400, with only the differences between the semiconductor devices 500, 400 being described below.

The sole distinction between the semiconductor devices 500, 400 lies in the substitution of the passive device 460 of the semiconductor device 400 with a conductive bump 560 in the semiconductor device 500. In this regard, in the semiconductor device 500, the TMV 451 is electrically connected to the conductive pattern 112a of the substrate 110 through the use of the conductive bump 560. It is contemplated that the conductive bump 560 may be fabricated from the same materials described above in relation to the conductive bumps 321 included in the semiconductor device 300. Thus, in the semiconductor device 500, the conductive bump 560 is interposed between the TMV 451 of the semiconductor package 450 and the conductive pattern 112 of the substrate 110.

In the semiconductor device 500, the package body 160 covers at least portions of the first semiconductor die 320, the semiconductor package 450, the conductive bump 560, and the conductive wires 255, 322. That portion of the package body 160 which is filled between the first surface portion 254a of the inner package body 254 and the substrate 110 covers the conductive bump 560, in addition to covering the first semiconductor die 320 and the conductive wire 322. The semiconductor device 500 is configured such that the TMV 451 formed in the inner package body 254 of the semiconductor package 450 is electrically connected to the substrate 110 through the use of the conductive bump 560 to process ground or power from the semiconductor package 450.

Figure 6:
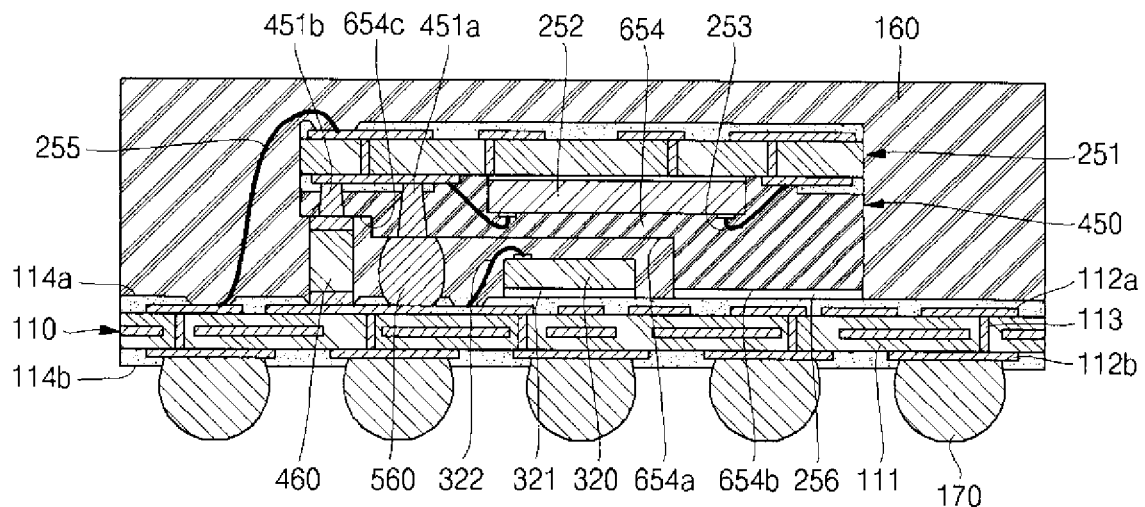
FIG. 6 is a cross-sectional view of a package-in-package semiconductor device constructed in accordance with a sixth embodiment of the present invention.

Referring now to FIG. 6, there is shown a semiconductor device 600 constructed in accordance with a sixth embodiment of the present invention. The semiconductor device 600 is similar to the above-described semiconductor devices 500, 400, with only the differences between the semiconductor devices 600, 500, 400 being described below.

Essentially, the semiconductor device 600 comprises a combination of the features included in the semiconductor devices 500, 400. In the semiconductor device 600, the semiconductor package 450 differs slightly from semiconductor package 450 included in the semiconductor devices 500, 400. More particularly, the inner package body 654 of the semiconductor package 450 included in the semiconductor device 600 includes a generally planar first surface portion 654a which extends along a first plane, a generally planar second surface portion 654b which extends along a second plane disposed in spaced, generally parallel relation to the first plane along which the first surface portions 254a extends, and a generally planar third surface portion 654c which extends along a third plane disposed in spaced, generally parallel relation to the first and second planes along which respective ones of the first and second surface portions 654a, 654b extend. Thus, as viewed from the perspective shown in FIG. 6, the first surface portion 654a is recessed relative to the second surface portion 654b, with the third surface portion 654c being recessed relative to the first surface portion 654a. In the semiconductor device 600, the second surface portion 654b is attached to the substrate 110 through the use of the adhesive layer 256.

In addition, the package body 654 of the semiconductor package 450 included in the semiconductor device 600 includes a first TMV 451a which is formed in the same manner as the above-described TMV 451, and extends from the first surface portion 654a of the inner package body 654 to a portion of the conductive pattern disposed on that surface of the insulating layer of the inner substrate 251 to which the inner semiconductor die 252 is mounted. In addition to the first TMV 451a, the inner package body 654 includes a second TMV 451b which is also formed in the same manner as the above-described TMV 451 and extends from the third surface portion 564c of the inner package body 654 to a portion of the conductive pattern disposed on that surface of the insulating layer of the inner substrate 251 to which the inner semiconductor die 252 is mounted.

In the semiconductor device 600, the above-described conductive bump 560 is interposed between and electrically connected to the first TMV 451a and the conductive pattern 112a of the substrate 110 in the same manner described above in relation to the conductive bump 560 and included in the semiconductor device 500. Additionally, in the semiconductor device 600, the above-described passive device 460 is interposed between and electrically connected to the second TMV 451b and the conductive pattern 112a of the substrate 110 in the same manner described above in relation to the passive device 460 included in the semiconductor device 400.

In the semiconductor device 600, the package body 160 covers at least portions of the first semiconductor die 320, the semiconductor package 450, the passive device 460, the conductive bump 560, and the conductive wires 255, 322. Portions of the package body 160 are filled between the first and third surface portions 654a, 654c of the inner package body 654 and the substrate 110. That portion of the package body 160 which is filled between the first surface portion 654a and the substrate 110 covers the conductive bump 560, in addition to covering the first semiconductor die 320 and the conductive wire 322. That portion of the package body 160 which is filled between the third surface portion 654c and the substrate 110 covers the passive device 460. Those of ordinary skill in the art will recognize that the inner package body 654 need not necessarily be formed to define the third surface portion 654c, with the first and second TMV's 451a, 451b being identically configured to each other, and each formed in the first surface portion 654a.

Figure 7:
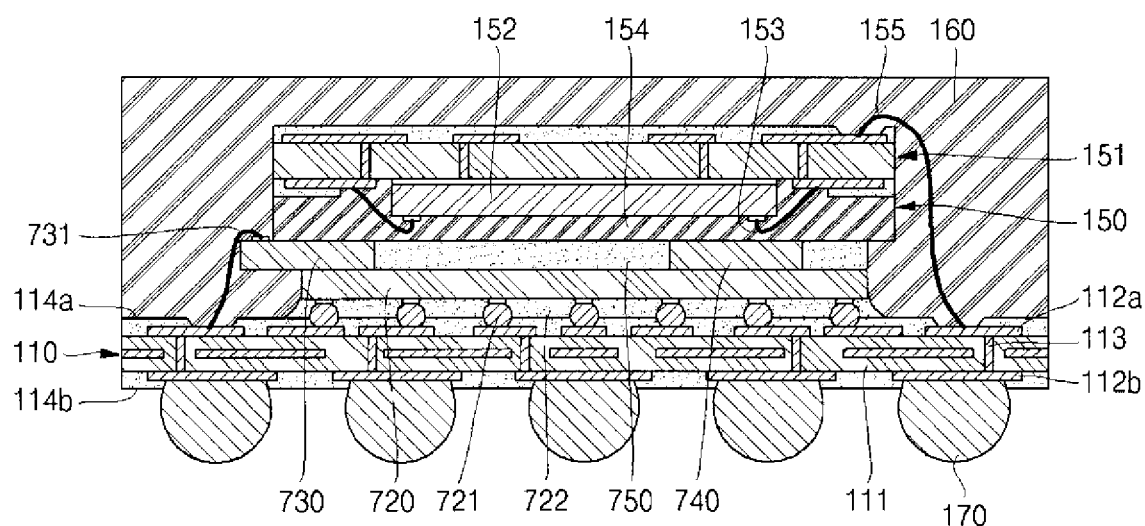
FIG. 7 is a cross-sectional view of a package-in-package semiconductor device constructed in accordance with a seventh embodiment of the present invention.

Referring now to FIG. 7, there is shown a semiconductor device 700 constructed in accordance with a seventh embodiment of the present invention. The semiconductor device 700 comprises the substrate 110 described above in relation to the semiconductor device 100. The semiconductor device 700 further comprises a first (bottom) semiconductor die 720 which electrically connected to the substrate 110, and in particular to the conductive pattern 112a thereof. The first semiconductor die 720 defines opposed, generally planar top and bottom surfaces, and includes a plurality of conductive contacts or terminals disposed on the bottom surface thereof. As seen in FIG. 7, each of the terminals is electrically connected to the conductive pattern 112a of the substrate 110 through the use of respective ones of a plurality of conductive bumps 721. The conductive bumps 721 may be fabricated from the same materials described above in relation to the conductive bumps 321 included in the semiconductor device 300. In the semiconductor device 700, an underfill material 722 is preferably filled between the first semiconductor die 720 and the substrate 110. More particularly, the underfill material 722 is disposed between the bottom surface of the first semiconductor die 720 and a portion of the solder mask 114a, the underfill material 722 also covering portions of the conductive bumps 721.

The semiconductor device 700 further comprises a second (middle) semiconductor die 730 which also defines opposed, generally planar top and bottom surfaces, and includes one or more conductive contacts or terminals disposed on the top surface thereof. As seen in FIG. 7, a portion of the bottom surface of the second semiconductor die 730 is in direct contact with a portion of the top surface of the first semiconductor die 720. The conductive terminals of the second semiconductor die 730 are preferably disposed on a portion thereof which protrudes outwardly relative to the peripheral side surface of the underlying first semiconductor die 720, as seen in FIG. 7. The second semiconductor die 730 is electrically connected to the substrate 110 through the use of at least one conductive wire 731. As seen in FIG. 7, one end of the conductive wire 731 is electrically connected to a corresponding terminal of the second semiconductor die 730, with the other end of the same conductive wire 731 being electrically connected to the conductive pattern 112a of the substrate 110.

In addition to the second semiconductor die 730, also attached to the top surface of the first semiconductor die 720 is a spacer 740. The spacer 740 defines opposed, generally planar top and bottom surfaces, the bottom surface being positioned upon the top surface of the first semiconductor die 720. The spacer 740 is preferably formed to be of substantially the same thickness as the second semiconductor die 730 for reasons which will be described in more detail below. Examples of suitable materials for the spacer 740 include, but are not limited to, silicon, glass, metals, or equivalents thereto.

The semiconductor device 700 further comprises the semiconductor package 150 described above in relation to the semiconductor device 100. In the semiconductor device 700, portions of the inner package body 154 of the semiconductor package 150 are positioned upon the top surface of the second semiconductor die 730 and the top surface of the spacer 740. An adhesive layer 750 is interposed between the top surface of the first semiconductor die 720 and the inner package body 154 to strongly adhere the semiconductor package 150 to the first semiconductor die 720. As is apparent from FIG. 7, the adhesive layer 750 contacts at least portions of the second semiconductor die 730 and the spacer 740. As is also apparent from FIG. 7, that portion of the second semiconductor die 731 which protrudes outwardly relative to the peripheral side surface of the first semiconductor die 720 also protrudes outwardly from a peripheral side surface of the inner package body 154 of the semiconductor package 150. Those of ordinary skill in the art will recognize that the protruding portion of the second semiconductor die 730 can protrude a predetermined length relative to the peripheral side surfaces of both the second semiconductor die 730 and the inner package body 154 of the semiconductor package 150. When the semiconductor package 150 is positioned upon the second semiconductor die 730 and the spacer 740, the virtually identical thicknesses of the second semiconductor die 730 and the spacer 740 prevent the overlying semiconductor package 150 from being inclined.

In the semiconductor device 700, the semiconductor package 150 is electrically connected to the conductive pattern 112a of the substrate 110 through the use of the conductive wire(s) 155 in the same manner described above in relation to the semiconductor device 100. Additionally, solder balls 170 are electrically connected to the conductive pattern 112b of the substrate 110 in the same manner also described above in relation to the semiconductor device 100. In the semiconductor device 700, the package body 160, which can be formed from the same material described above in relation to the package body 160 of the semiconductor device 100, covers at least portions of the first semiconductor die 720, the second semiconductor die 730, the semiconductor package 150, and the conductive wires 155, 731.

The semiconductor device 700 is configured such that the second semiconductor die 730 is embedded between the first semiconductor die 720 and the semiconductor package 150. With this configuration, the thickness of the semiconductor device 700 can be reduced. Specifically, that portion of the second semiconductor die 730 protruding from the first semiconductor die 720 and the semiconductor package 150 is electrically connected to the substrate 110 through the use of the conductive wire(s) 731. As a result, there no increase in the thickness of the semiconductor device 700 attributable to the loop height of the conductive wire(s) 731. In other words, if no portion of the second semiconductor die 730 protrudes, the position of the semiconductor package 150 would need to be moved upward by the loop height of the conductive wire(s) 731, thus resulting in the semiconductor device 700 becoming thicker by an amount corresponding to the loop height.

Figure 8:
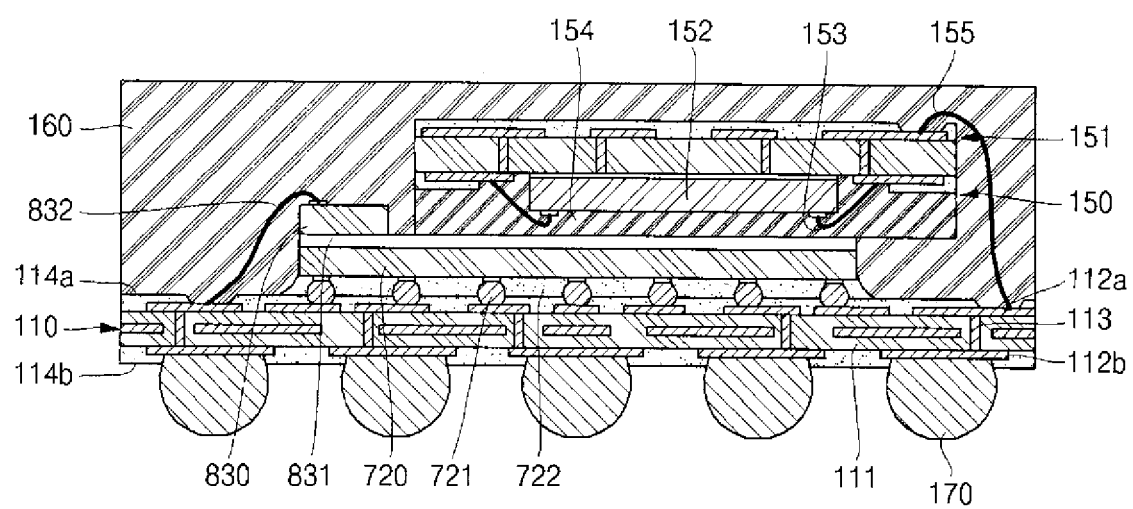
FIG. 8 is a cross-sectional view of a package-in-package semiconductor device constructed in accordance with an eighth embodiment of the present invention.

Referring now to FIG. 8, there is a shown a semiconductor device 800 constructed in accordance with an eighth embodiment of the present invention. The semiconductor device 800 is substantially similar to the above-described semiconductor device 700, with only the differences between the semiconductor devices 800, 700 being described below.

The primary distinction between the semiconductor devices 800, 700 lies in the elimination of the spacer 740 described above in relation to the semiconductor device 700 in the semiconductor device 800, and the substitution of the second semiconductor die 730 of the semiconductor device 700 with the second semiconductor die 830 included in the semiconductor device 800. More particularly, as seen in FIG. 8, the second semiconductor die 830 defines opposed, generally planar top and bottom surfaces, and includes a plurality of conductive contacts or terminals disposed on the top surface thereof. The bottom surface of the second semiconductor die 831 is attached to the top surface of the first semiconductor die 720 through the use of an adhesive layer 831. At least one conductive wire 832 is used to electrically connect the second semiconductor die 830 to the substrate 110. More particularly, as seen in FIG. 8, one end of the conductive wire 832 is electrically connected to a corresponding terminal of the second semiconductor die 830, with the remaining end of the same conductive wire 832 being electrically connected to the conductive pattern 112a of the substrate 110. As is also apparent from FIG. 8, no portion of the second semiconductor die 830 overhangs or protrudes outwardly from the peripheral side surface of the first semiconductor die 720.

In the semiconductor device 800, the inner package body 154 of the semiconductor package 150 is mounted to the top surface of the first semiconductor die 720 through the use of the same adhesive layer 831 used to mount the second semiconductor die 830 thereto. Thus, the second semiconductor die 830 and the semiconductor package 150 are disposed in side-by-side relation to each other. However, as is shown in FIG. 8, a portion of the semiconductor package 150, and in particular that portion to which the conductive wire 155 extends, overhangs or protrudes outwardly relative to the peripheral side surface of the first semiconductor die 720. Such protrusion preferably occurs at a predetermined length. However, those of ordinary skill in the art will recognize that no such protrusion need necessarily occur in the event that the width of the semiconductor package 150 is sufficiently small.

In the semiconductor device 800, the package body 160 covers at least portions of the first semiconductor die 720, the second semiconductor die 830, the semiconductor package 150, and the conductive wires 155, 832. In the semiconductor device 800, the semiconductor package 150 is not positioned on the second semiconductor die 830, but rather is adhered to the first semiconductor die 720, thus resulting in a marked reduction in the thickness of the semiconductor device 800. That is, the thickness of the semiconductor device 800 is not dependent on the thickness of the second semiconductor die 830 and the loop height of the conductive wire(s) 832.

Figure 9:
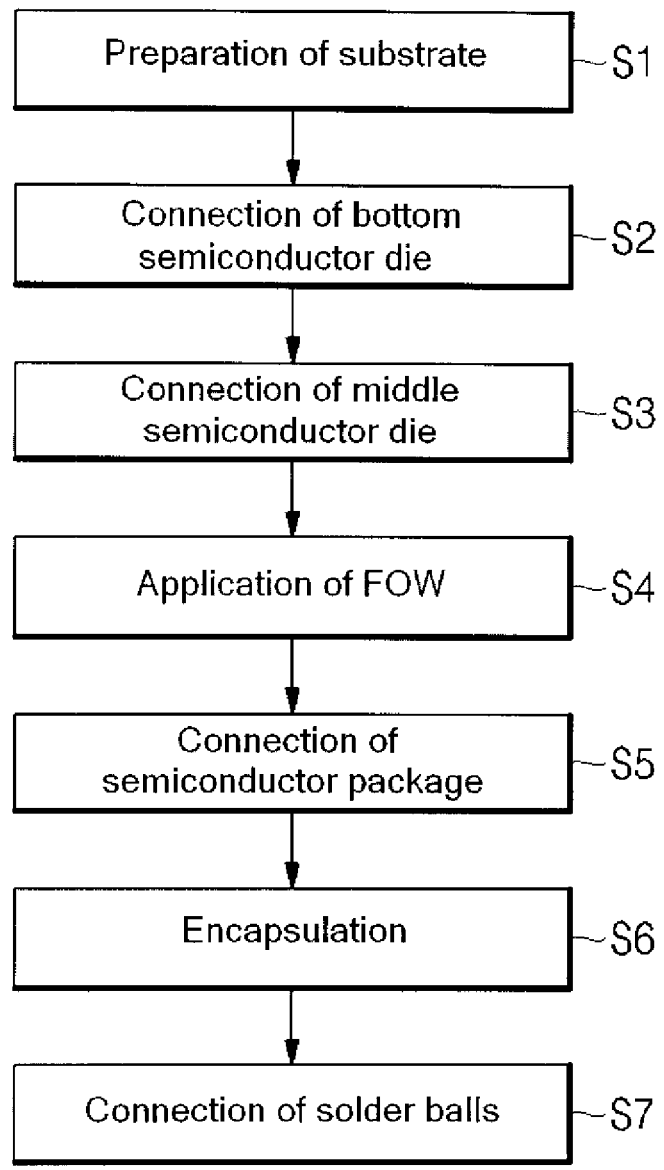
FIG. 9 is a flow chart illustrating an exemplary fabrication method for the package-in-package semiconductor device shown in FIG. 1.

Referring now to FIG. 9, there is provided a flow chart which sets forth an exemplary method for fabricating the semiconductor device 100 of the present invention shown in FIG. 1A. The method comprises the steps of preparing the substrate (S1), the connection of the first (bottom) semiconductor die (S2), the connection of the second (middle) semiconductor die (S3), the application of the film-over-wire (S4), the connection of the semiconductor package (S5), encapsulation (S6), and the connection of solder balls (S7). FIGS. 10A-10G provide illustrations corresponding to these particular steps, as will be discussed in more detail below.

Figure 10A:
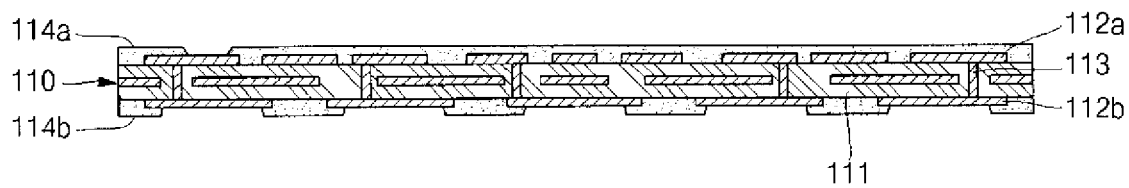
FIGS. 10A-10G are views illustrating an exemplary fabrication method for the package-in-package semiconductor devive shown in FIG. 1.
Figure 10B:
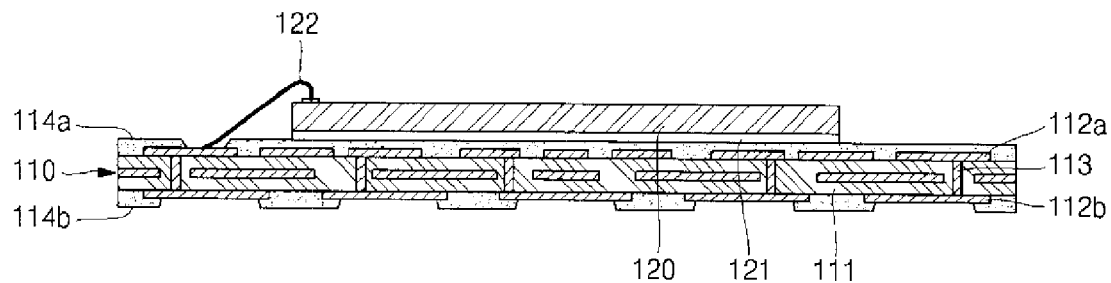

Referring now to FIG. 10A, in the initial step S1 of the fabrication process for the semiconductor device 100, the substrate 110 having the above-described structural attributes is provided. Thereafter, as illustrated in FIG. 10B, step S2 is completed wherein the first semiconductor die 120 is electrically connected to the conductive pattern 112a of the substrate 110 through the use of the conductive wires 122 in the above-described manner. As also indicated above, the adhesive layer 121 is used to mount the first semiconductor die 120 to the substrate 110.

Figure 10C:
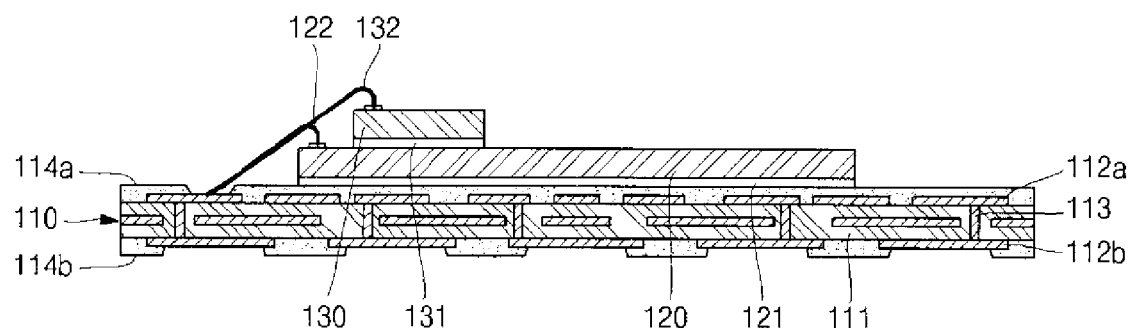
Figure 10D:
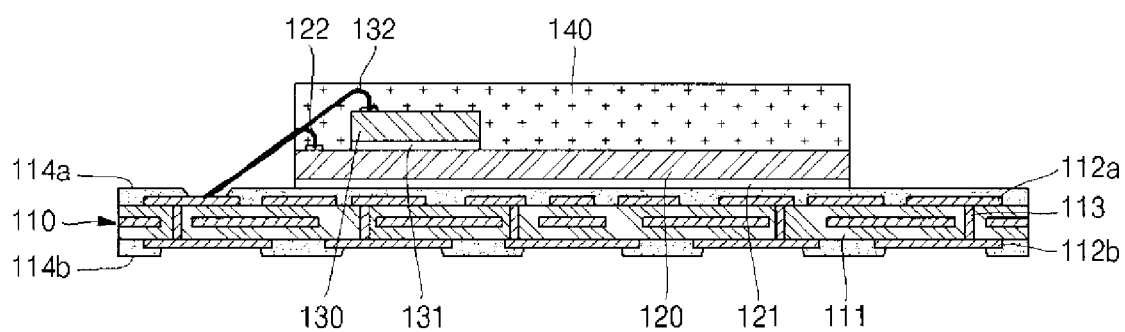

Referring now to FIG. 10C, in the next step S3 of the fabrication process for the semiconductor device 100, the second semiconductor die 130 is mounted to the first semiconductor die 120 and electrically connected to the conductive pattern 112a of the substrate 110 through the use of the conductive wires 132 in the above-described manner. As also indicated above, the adhesive layer 131 is used to mount the second semiconductor die 130 to the first semiconductor die 120. Thereafter, as illustrated in FIG. 10D, step S4 is completed wherein the FOW 140 in a semi-cured state (B-stage) is applied to the first and second semiconductor dies 120, 130 and to the conductive wires 122, 132 in the above-described manner.

Figure 10E:
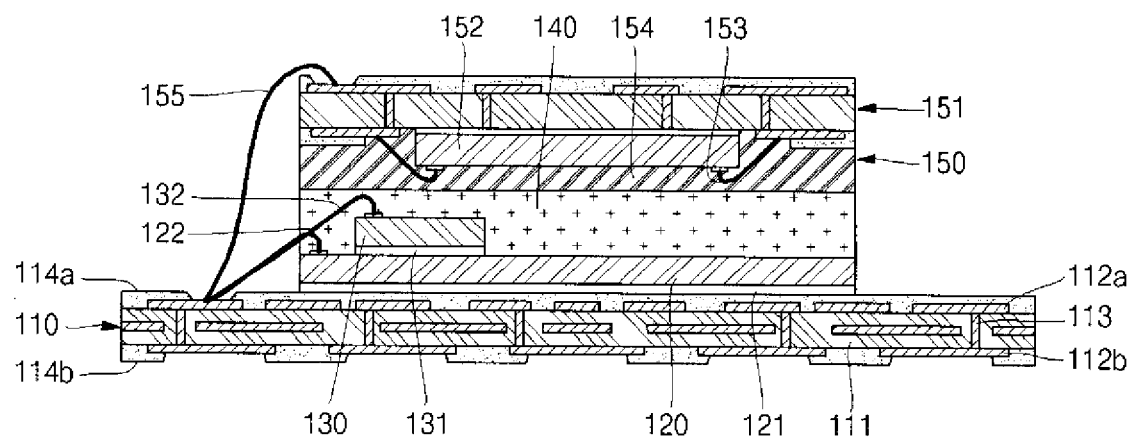

Referring now to FIG. 10E, in the next step S5 of the fabrication process for the semiconductor device 100, the semiconductor package 150 is placed upon the FOW 140, with the FOW 140 thereafter being cured. The curing is typically conducted at a temperature range of about 150° C. to about 250° C. A specially designed jig can be used to allow the semiconductor package 150 to push down the FOW 140 under a predetermined pressure while maintaining the semiconductor package 150 generally parallel to the first semiconductor die 120 on the FOW 140. In this state, the resulting structure is heated at the aforementioned temperature range of about 150° C. to about 250° C. to harden the FOW 140 to strongly adhere the FOW 140 to the semiconductor package 150. Thereafter the semiconductor package 150 is electrically connected to the conductive pattern 112a of the substrate 110 through the use of the conductive wires 155 in the above-described manner.

Figure 10F:
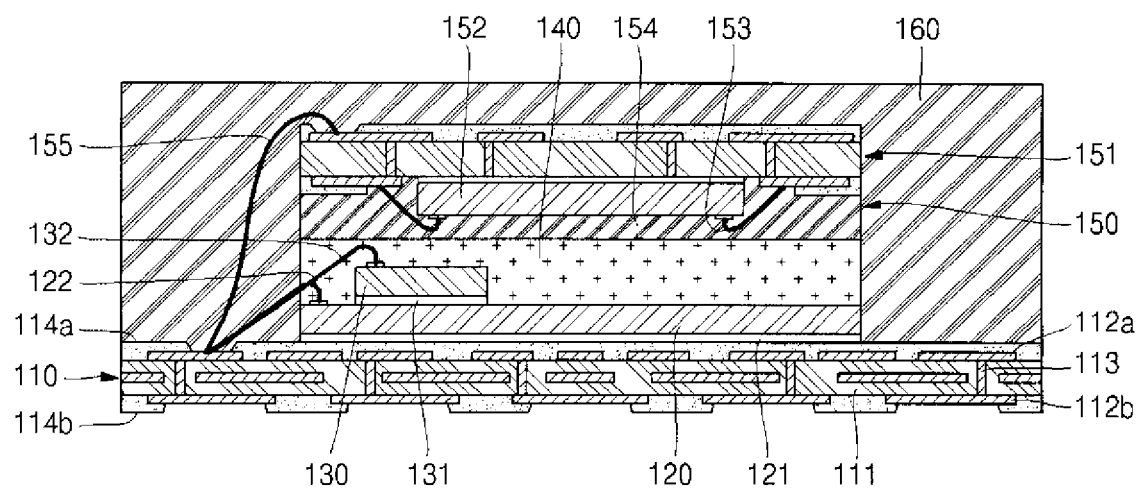

Referring now to FIG. 10F, in the next step S6 of the fabrication process for the semiconductor device 100, at least portions of the substrate 110, the first semiconductor die 120, the FOW 140, the semiconductor package 150, and the conductive wires 122, 132, 155 are each encapsulated or covered by an encapsulant material which ultimately hardens into the package body 160 of the semiconductor device 100. As indicated above, the fully formed package body 160 preferably includes side surfaces which extend in generally flush or co-planar to respective side surfaces of the insulating layer 111 of the substrate 110. The encapsulation step S6 can be carried out by transfer molding using a mold or dispensing molding using a dispenser.

Figure 10G:
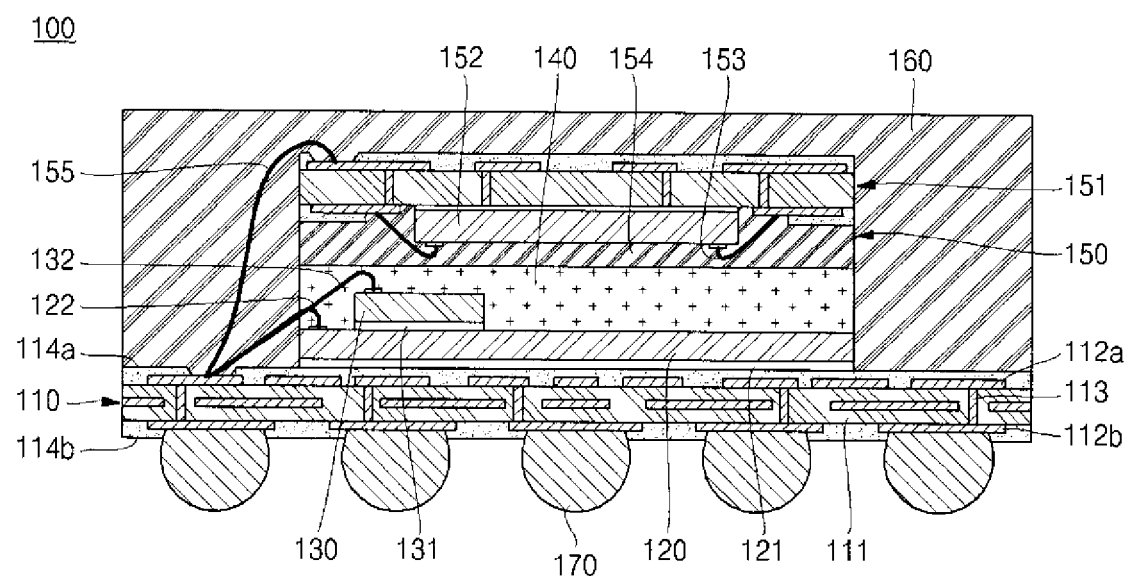

Referring now to FIG. 10G, in the next step S7 of the fabrication process for the semiconductor device 100, the solder balls 170 are electrically connected to prescribed portions of the conductive pattern 112b of the substrate 110. As seen in FIG. 10G, the solder mask 114b extends into contact with the solder balls 170. The solder balls 170 may be fabricated from the same materials described above.

Though not shown, the electrical connection of the solder balls 170 to the conductive pattern 112b may be followed by marking and sawing steps in relation to the semiconductor device 100. In the marking step, laser or ink is used to mark the product name, the trademark and the manufacturer of the semiconductor device 100 on a prescribed surface of the package body 160. Typically, a plurality of semiconductor devices 100 will be fabricated on a broad substrate in the form of a matrix comprising a plurality of interconnected substrates 110. In the sawing step, the individual semiconductor devices 100 are separated from the broad substrate.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure. For example, any of the above-described substrates 110, 151, 251 may be substituted with a leadframe without departing from the spirit and scope of the present invention.

What is claimed is:

1. A semiconductor device, comprising:
   a substrate having an electrically conductive pattern formed thereon;
   a first semiconductor die disposed on the substrate and electrically connected to the conductive pattern thereof by at least one conductive wire;
   a second semiconductor die disposed on the first semiconductor die and electrically connected to the conductive pattern of the substrate by at least one conductive wire;
   a film-over-wire disposed on at least a portion of the second semiconductor die;
   a semiconductor package positioned on the film-over-wire and electrically connected to the conductive pattern of the substrate by at least one conductive wire; and
   a package body which encapsulates at least portions of the substrate, the first semiconductor die, the film over wire, the second semiconductor die and the semiconductor package, with at least one of the conductive wires being encapsulated by the package body and at least one of the conductive wires being partially encapsulated by both the film over wire and the package body.

2. The semiconductor device of claim 1 further comprising a plurality of solder balls electrically connected to the conductive pattern of the substrate.

3. The semiconductor device of claim 1 wherein the package body encapsulates a portion of the substrate, and completely encapsulates the first semiconductor die, the film over wire, the second semiconductor die and the semiconductor package.

4. The semiconductor device of claim 1 wherein the semiconductor package is positioned on and immediately adjacent to both the film-over-wire and the substrate.

5. The semiconductor device of claim 1 wherein:
   the first semiconductor die defines a top surface;
   the second semiconductor die defines top and side surfaces;
   the film-over-wire is applied to the top surface of the first semiconductor die, and the top and side surfaces of the second semiconductor die.

6. The semiconductor device of claim 1 wherein:
   the first semiconductor die defines a top surface;
   the second semiconductor die defines top and side surfaces; and
   the film-over-wire is applied to the top surface of the second semiconductor die.

7. The semiconductor device of claim 6 wherein the semiconductor package comprises:
   an inner substrate having a conductive pattern disposed thereon, the conductive pattern of the inner substrate being electrically connected to the conductive pattern of the substrate by the at least one conductive wire;
   an inner semiconductor die mounted to the inner substrate and electrically connected to the conductive pattern thereof;
   an inner package body at least partially encapsulating the inner substrate and the inner semiconductor die, the inner package body defining a first surface portion which is attached and immediately adjacent to the film-over-wire and a second surface portion which is attached and immediately adjacent to the top surface of the first semiconductor die.

8. A semiconductor device, comprising:
a substrate having an electrically conductive pattern formed thereon;
a first semiconductor die electrically connected to the conductive pattern of the substrate;
a semiconductor package directly attached to the substrate by an adhesive layer and electrically connected to the conductive pattern thereof, the first semiconductor die being disposed between the substrate and a portion of the semiconductor package; and
a package body which encapsulates at least portions of the substrate, the first semiconductor die, and the semiconductor package.

9. The semiconductor device of claim 8 wherein the first semiconductor die is electrically connected to the conductive pattern of the substrate through the use of at least one conductive bump which is at least partially encapsulated by the package body, and the semiconductor package is electrically connected to the conductive pattern of the substrate through the use of at least one conductive wire which is at least partially encapsulated by the package body.

10. The semiconductor device of claim 9 wherein the semiconductor package comprises:
an inner substrate having a conductive pattern disposed thereon, the conductive pattern of the inner substrate being electrically connected to the conductive pattern of the substrate by at least one of the conductive wires;
an inner semiconductor die mounted to the inner substrate and electrically connected to the conductive pattern thereof;
an inner package body at least partially encapsulating the inner substrate and the inner semiconductor die, the inner package body defining a first surface portion which contacts the first semiconductor die, and a second surface portion which is directly attached to the substrate by the adhesive layer.

11. The semiconductor device of claim 8 wherein the first semiconductor die and the semiconductor package are each electrically connected to the conductive pattern of the substrate through the use of conductive wires which are at least partially encapsulated by the package body.

12. The semiconductor device of claim 11 wherein the semiconductor package comprises:
an inner substrate having a conductive pattern disposed thereon, the conductive pattern of the inner substrate being electrically connected to the conductive pattern of the substrate by at least one of the conductive wires;
an inner semiconductor die mounted to the inner substrate and electrically connected to the conductive pattern thereof;
an inner package body at least partially encapsulating the inner substrate and the inner semiconductor die, the inner package body defining a first surface portion having at least one through mold via disposed therein and electrically connected to the conductive pattern of the inner substrate, and a second surface portion which is directly attached to the substrate by the adhesive layer.

13. The semiconductor device of claim 12 further comprising a passive device interposed between and electrically connected to the conductive pattern of the substrate and the through mold via of the semiconductor package.

14. The semiconductor device of claim 12 further comprising a conductive bump interposed between and electrically connected to the conductive pattern of the substrate and the through mold via of the semiconductor package.

15. The semiconductor device of claim 12 wherein:
an inner substrate further comprises a third surface portion having at least one through mold via disposed therein and electrically connected to the conductive pattern of the inner substrate;
a passive device is interposed between and electrically connected to the conductive pattern of the substrate and one of the through mold via of the semiconductor package; and
a conductive bump is interposed between and electrically connected to the conductive pattern of the substrate and one of the through mold visa of the semiconductor package.

16. A semiconductor device, comprising:
a substrate having an electrically conductive pattern formed thereon;
a first semiconductor die electrically connected to the conductive pattern of the substrate through the use of conductive bumps;
a second semiconductor die disposed on the first semiconductor die and electrically connected to the conductive pattern of the substrate;
a semiconductor package stacked upon the first semiconductor die and electrically connected to the conductive pattern of the substrate, a portion of the semiconductor package being in direct contact with the second semiconductor die; and
a package body which encapsulates at least portions of the substrate, the first semiconductor die, the conductive bumps, the second semiconductor die and the semiconductor package.

17. The semiconductor device of claim 16 further comprising a spacer interposed between the semiconductor package and the first semiconductor die.

18. A semiconductor device, comprising:
a substrate having an electrically conductive pattern formed thereon;
a first semiconductor die electrically connected to the conductive pattern of the substrate through the use of conductive bumps;
a second semiconductor die directly attached to the first semiconductor die by an adhesive layer and electrically connected to the conductive pattern of the substrate;
a semiconductor package directly attached to the first semiconductor die by an adhesive layer in side-by-side relation to the second semiconductor die, and electrically connected to the conductive pattern of the substrate; and
a package body which encapsulates at least portions of the substrate, the first semiconductor die, the conductive bumps, the second semiconductor die and the semiconductor package.

\* \* \* \* \*